(12) United States Patent
Park et al.

(10) Patent No.: US 11,508,938 B2
(45) Date of Patent: Nov. 22, 2022

(54) DISPLAY DEVICE

(71) Applicant: Samsung Display Co., LTD., Yongin-si (KR)

(72) Inventors: Young Gil Park, Asan-si (KR); Ki Hyun Kim, Hwaseong-si (KR); Young Jun Yoo, Goyang-si (KR); Jong Beom Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/215,722

(22) Filed: Mar. 29, 2021

(65) Prior Publication Data
US 2022/0077424 A1 Mar. 10, 2022

(30) Foreign Application Priority Data
Sep. 7, 2020 (KR) .................. 10-2020-0114150

(51) Int. Cl.
| | | |
|---|---|---|
| *H01L 51/52* | (2006.01) | |
| *H01L 27/32* | (2006.01) | |
| *G06F 3/041* | (2006.01) | |
| *G09G 3/3208* | (2016.01) | |
| *G06F 3/044* | (2006.01) | |

(52) U.S. Cl.
CPC ........ *H01L 51/5253* (2013.01); *G06F 3/0412* (2013.01); *G09G 3/3208* (2013.01); *H01L 27/323* (2013.01); *G06F 3/044* (2013.01)

(58) Field of Classification Search
CPC . H01L 51/5253; H01L 27/323; G09G 3/3208; G06F 3/0412; G06F 3/044
USPC .......................................... 345/173, 174, 76
See application file for complete search history.

(56) References Cited

U.S. PATENT DOCUMENTS

| | | | |
|---|---|---|---|
| 2005/0101718 A1* | 5/2005 | Lechtenboehmer | .... C08L 21/00 524/495 |
| 2015/0248140 A1* | 9/2015 | Hsu | .............. C03C 17/3441 345/173 |
| 2015/0299470 A1* | 10/2015 | Ngo | ................. G02B 1/118 345/173 |
| 2018/0033832 A1* | 2/2018 | Park | .................. G06F 3/04164 |
| 2018/0226614 A1* | 8/2018 | Jin | ................. H01L 51/5253 |

FOREIGN PATENT DOCUMENTS

| | | |
|---|---|---|
| CN | 107182175 | 9/2017 |
| JP | 2016-122097 | 7/2016 |
| KR | 10-1722626 | 4/2017 |
| KR | 10-2084110 | 3/2020 |

* cited by examiner

*Primary Examiner* — Jimmy H Nguyen
(74) *Attorney, Agent, or Firm* — Kile Park Reed & Houtteman PLLC

(57) ABSTRACT

The disclosure relates to a display device including a display panel, an inorganic layer directly contacting the display panel, and a carbon layer directly contacting the inorganic layer. A thickness of the carbon layer is about 1 nm to about 10 nm.

18 Claims, 12 Drawing Sheets

DISPLAY DEVICE

CROSS-REFERENCE TO RELATED APPLICATION(S)

This application claims priority to and the benefit of Korean Patent Application No. 10-2020-0114150 under 35 U.S.C. § 119, filed in the Korean Intellectual Property Office (KIPO) on Sep. 7, 2020, the entire contents of which are incorporated herein by reference.

BACKGROUND

1. Technical Field

The disclosure relates to a display device, and particularly, it relates to a display device to which a carbon layer is applied instead of a cover window.

2. Description of the Related Art

Recently, various mobile electronic devices such as mobile phones, navigation systems, digital cameras, electronic books, portable game devices, or various types of terminals, have been in use. The various mobile electronic device may employ a liquid crystal display (LCD) or an organic light emitting diode (OLED) as a display device.

A conventional display device employed by the mobile electronic devices includes a cover window, which is attached to a display panel and transparent so that a user may see an image through the cover window.

The cover window is attached by an additional process after the display panel is manufactured. During a process for moving a display panel to attach a cover window thereto, the display panel may be damaged, and an additional process for attaching the cover window should be performed after manufacturing the display panel.

The above information disclosed in this Background section is only for enhancement of understanding of the background of the disclosure, and therefore it may contain information that does not form the prior art that is already known in this country to a person of ordinary skill in the art.

SUMMARY

The disclosure provides a display device for simplifying a manufacturing process by applying a carbon layer instead of a cover window.

An embodiment of the disclosure provides a display device including a display panel; an inorganic layer directly contacting the display panel; and a carbon layer directly contacting the inorganic layer, wherein a thickness of the carbon layer is about 1 nm to about 10 nm.

The carbon layer may include amorphous carbon.

The carbon layer may include crystalline carbon.

The carbon layer may include a region arranged in a simple cubic (SC) structure and a region arranged in a hexagonal close packed (HCP) structure.

The carbon layer may include a region in which amorphous carbon is disposed.

A refractive index of the carbon layer may be about 1.6 to about 2.0.

The inorganic layer may include a silicon-containing compound.

The inorganic layer may be a single layer or a multilayer.

A thickness of the inorganic layer may be about 400 nm to about 1 μm.

The inorganic layer may have a single-layered or multi-layered structure including at least one of a SiON, a $SiN_x$, and a $SiO_x$.

The inorganic layer may include a first layer including a $SiN_x$, a second layer including a SiON, a third layer including a $SiN_x$, and a fourth layer including a SiON.

The inorganic layer may configure (or form) a distributed Bragg reflector.

The display panel may include a substrate; a light-emitting device layer disposed on the substrate; a thin film encapsulation layer disposed on the light-emitting device layer; and a touch sensing layer disposed on the thin film encapsulation layer, and the inorganic layer directly contacts the touch sensing layer.

The touch sensing layer may include a first insulating layer directly contacting the thin film encapsulation layer; a first sensing electrode disposed on the first insulating layer; a second insulating layer disposed on the first sensing electrode; a second sensing electrode disposed on the second insulating layer; and a third insulating layer disposed on the second sensing electrode, and the inorganic layer may directly contact the third insulating layer of the touch sensing layer.

The display device may not include a cover window.

A transmittance of a stacked structure of the inorganic layer and the carbon layer may be equal to or greater than about 88%, and a reflectance of the stacked structure of the inorganic layer and the carbon layer may be equal to or less than about 10%.

An embodiment of the disclosure provides a display device including a display panel; an adhesive layer directly contacting the display panel; an inorganic layer directly contacting the adhesive layer; and a carbon layer directly contacting the inorganic layer, wherein a thickness of the carbon layer is about 1 nm to about 10 nm.

The carbon layer may include amorphous carbon or crystalline carbon.

The carbon layer may include a region arranged in a simple cubic (SC) structure and a region arranged in a hexagonal close packed (HCP) structure.

The inorganic layer may have a single-layered or multi-layered structure including a silicon-containing compound, and a thickness of the inorganic layer may be about 400 nm to about 1 μm.

According to the embodiments, the display device for simplifying the manufacturing process by applying the carbon layer instead of the cover window is provided.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
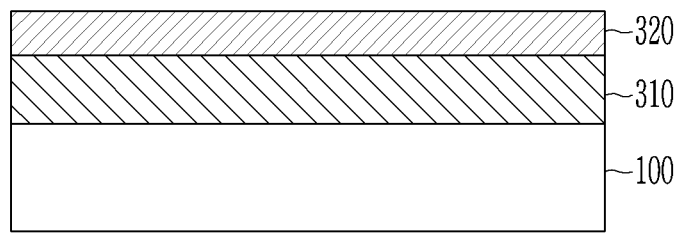
FIG. 1 is a schematic cross-sectional view of a display device according to an embodiment.

Hereinafter, embodiments disclosed in the specification will be described in detail with reference to the accompanying drawings. In the specification, the same or similar components will be denoted by the same or similar reference numerals, and an overlapped description thereof will be omitted. As those skilled in the art would realize, the described embodiments may be modified in various different ways, all without departing from the spirit or scope of the disclosure.

Parts that are irrelevant to the description may be omitted to clearly describe the disclosure, and the same elements will be designated by the same reference numerals throughout the specification.

The thicknesses of some layers and areas may be exaggerated for convenience of explanation. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means being positioned on or below the object portion and does not necessarily mean being positioned on the upper side of the object portion based on a gravitational direction.

Unless explicitly described to the contrary, the word "comprise" or "include" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

A display device according to an embodiment of the disclosure will now be described with reference to accompanying drawings. FIG. 1 shows a cross-sectional view of a display device according to an embodiment.

Referring to FIG. 1, the display device may include a display panel 100, an inorganic layer 310 positioned on the display panel 100, and a carbon layer 320 positioned on the inorganic layer 310. The inorganic layer 310 may include a silicon-based material, and the carbon layer 320 may include carbon.

The display panel 100 may directly contact the inorganic layer 310, and the inorganic layer 310 may directly contact the carbon layer 320.

As shown in FIG. 1, the display device does not include elements such as a cover window, an anti-fingerprint layer, or a polarization layer, and may include an inorganic layer 310 and a carbon layer 320. Therefore, the manufacturing process may be simplified, and the display device is manufactured according to a consecutive process, thereby minimizing movement during the manufacturing process, and reducing the possibility of generation of defects caused by the movement during the manufacturing.

Respective elements will now be described in detail.

The display panel 100 may include a transistor and a light-emitting device LED electrically connected to the transistor. The display panel 100 may further include a touch sensing layer. In detail, the display panel 100 may include a LTPS layer (low-temperature polysilicon layer) on which a transistor is positioned, a light-emitting device electrically connected to the LTPS layer, a thin film encapsulation layer for covering or overlapping the light-emitting device, and a touch sensing layer positioned on the thin film encapsulation layer. The display panel 100 may further include a light blocking member positioned between the light emitting devices, and color filters positioned over the light emitting devices. The touch sensing layer may include a plurality of touch sensing layers with an insulating layer positioned therebetween and may be positioned on an upper portion of the thin film encapsulation layer. The description on the display panel 100 is an example and the disclosure is not limited thereto. Detailed descriptions on the display panel 100 will be provided below.

The inorganic layer 310 may be a single layer or a multilayer. The inorganic layer 310 includes a silicon-based material. For example, the inorganic layer 310 may be a single layer or a multilayer including at least one of a SiON, a $SiN_x$, and a $SiO_x$. A thickness of the inorganic layer 310 may be about 200 nm to about 1 µm. This numerical range allows the inorganic layer 310 to have transmittance and reflectance that are appropriate for the display device. In case that the thickness of the inorganic layer 310 is equal to or less than about 200 nm, a sufficient effect of improving emission intensity may not be obtained, and in case that the thickness of the inorganic layer 310 is equal to or greater than about 1 µm, transmittance may be deteriorated.

The multi-layered inorganic layer 310 may configure a distributed Bragg reflector (DBR). The distributed Bragg reflector (DBR) is formed by repeatedly stacking two transparent materials with different refractive indexes, and in case that light emitted by the light-emitting device LED passes through the distributed Bragg reflector (DBR), emission intensity is improved and a full width at half maximum of a light emitting spectrum is reduced to acquire relatively pure light. In detail, the full width at half maximum of light having passed through the distributed Bragg reflector (DBR) may be about 1 nm to about 4 nm.

For example, in the embodiment, the inorganic layer 310 may be formed by alternately stacking silicon-based materials with different refractive indexes. The inorganic layer 310 may be provided by a chemical vapor deposition (CVD) process. The configuration in which the inorganic layer 310 has a multilayer will be described in detail in a subsequent embodiment.

The carbon layer 320 includes carbon, and includes amorphous carbon or crystalline carbon. The thickness of the carbon layer 320 may be about 1 nm to about 10 nm. In case that the thickness of the carbon layer 320 is less than about 1 nm, the carbon layer 320 may not have a sufficient mechanical characteristic, and in case that the thickness of the carbon layer 320 is greater than about 10 nm, transmittance of the display device may be reduced. The carbon layer 320 may replace the conventional configuration of the cover window and may have a similar mechanical characteristic to the cover window.

The carbon layer 320 may include amorphous carbon. In case that the amorphous carbon having a thickness of 1 nm to 10 nm is positioned, the amorphous carbon may transmit light transparently and may have a similar mechanical characteristic to the cover window. In case that the carbon layer 320 includes amorphous carbon, the carbon layer 320 may have a partially crystallized region.

The carbon layer 320 may include crystalline carbon. For example, the carbon layer 320 may include diamond-like carbon (DLC). In the carbon layer 320, the carbons may be arranged in a simple cubic (SC) structure or a hexagonal close packed (HCP) structure and may be crystallized. In case that the carbon layer 320 includes crystalline carbon, the SC crystal structure and the HCP crystal structure may be mixed and positioned in the carbon layer 320. Further, in case that the carbon layer 320 includes crystalline carbon, the carbon layer 320 may have a partially amorphous region.

For example, the carbon layer 320 may further include a halogen together with the carbon. The halogen may be positioned in the crystalline carbon structure or may be positioned on a surface of the carbon layer 320. The carbon layer 320 is crystallized at room temperature, and in this instance, the halogen may be injected to increase crystallinity. In case that the halogen is injected, crystallinity of the carbon increases, and the injected halogen may remain in the carbon layer 320 or on the surface. For example, the carbon layer 320 may include an F-diamane in which fluorine is permeated into the carbon structure.

The carbon layer 320 may be formed by depositing an amorphous carbon layer by a chemical vapor deposition (CVD) or a RF sputtering process. After this, it may be crystallized at room temperature or may be crystallized at room temperature after the halogen is injected to thus form a crystalline carbon layer.

For example, the display device according to the embodiment does not include an adhesive layer, a cover window, a polarization layer positioned on an upper side of the display panel. Instead of this, as shown in FIG. 1, the display device may include an inorganic layer 310 directly contacting the display panel 100 and a carbon layer 320 directly contacting the inorganic layer 310. The inorganic layer 310 may improve emission intensity of the light-emitting device and may increase color purity, and the carbon layer 320 may replace the cover window while having similar mechanical properties to the cover window. The embodiment described with reference to FIG. 1 does not include a polarization layer, an adhesive layer, and a cover window, so the manufacturing process thereof is simple. Further, the inorganic layer 310 and the carbon layer 320 may be manufactured by using CVD or RF-sputtering used for the process for manufacturing a display panel 100, so they may be consecutively manufactured in an apparatus. Therefore, defects caused by transfer during the manufacturing may be reduced. The mechanical characteristic, transmittance, and reflectance of the display device may be maintained while manufacturing it by the simplified process.

Figure 2:
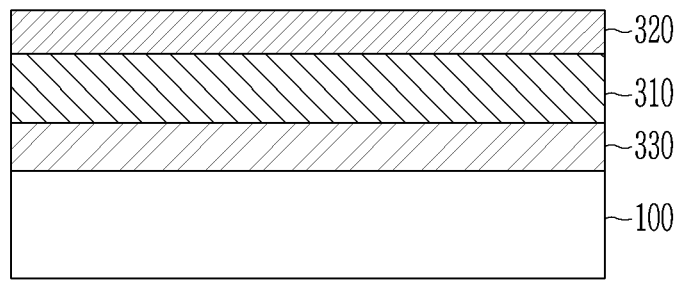
FIG. 2 is a schematic cross-sectional view of a display device according to another embodiment.

A display device according to another embodiment will now be described. FIG. 2 is a schematic cross-sectional view of a display device according to another embodiment. Referring to FIG. 2, this embodiment may be identical to an embodiment described with reference to FIG. 1 except that it further includes an adhesive layer 330. No detailed descriptions on the same elements will be provided.

Referring to FIG. 2, the display device may further include an adhesive layer 330 positioned between the display panel 100 and the inorganic layer 310. The adhesive layer 330 may include an optically clear adhesive (OCA) or an optically clear resin (OCR).

For example, in an embodiment of FIG. 2, the display panel 100 may directly contact the adhesive layer 330, and the adhesive layer 330 may directly contact the inorganic layer 310.

In the display device in FIG. 1, the inorganic layer 310 may be deposited on an upper side of the display panel 100, so the display panel 100 may be attached to the inorganic layer 310 without an additional adhesive layer. However, in case that the adhesive layer 330 is positioned between the display panel 100 and the inorganic layer 310 as in FIG. 2, the display panel 100 may be further stably attached to the inorganic layer 310.

Figure 3:
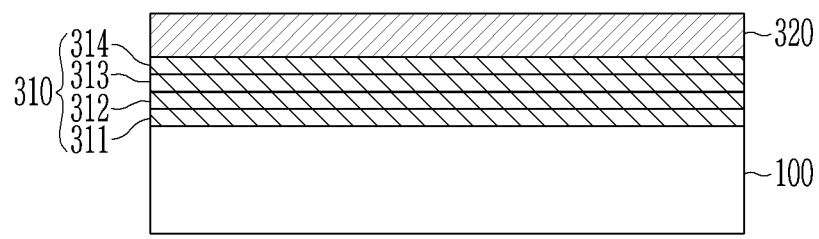
FIG. 3 is a schematic cross-sectional view of a display device according to another embodiment.

FIG. 3 is a schematic cross-sectional view of a display device according to another embodiment. Referring to FIG. 3, this embodiment may be identical to an embodiment described with reference to FIG. 1 except that the inorganic layer 310 has a multi-layered structure. No detailed descriptions on the same constituent elements will be provided.

Referring to FIG. 3, an inorganic layer 310 of a display device according to the embodiment may include a first layer 311, a second layer 312, a third layer 313, and a fourth layer 314. As shown in FIG. 3, the inorganic layer 310 may include four layers, which is however an example, and the inorganic layer 310 may include two to ten layers.

The first layer 311 to the fourth layer 314 may include at least one of a SiON, a $SiN_x$, and a $SiO_x$.

In this case, the first layer 311 and the third layer 313 may include a same material, and the second layer 312 and the fourth layer 314 may include a same material. For example, the first layer 311 and the third layer 313 may include $SiO_2$, and the second layer 312 and the fourth layer 314 may include a SiON. In another example, the first layer 311 and the third layer 313 may include a $SiN_x$, and the second layer 312 and the fourth layer 314 may include a SiON. This however is an example, and the disclosure is not limited thereto.

Further, refractive indexes of the first layer 311 and the third layer 313 may be the same, and refractive indexes of the second layer 312 and the fourth layer 314 may be the same. In this case, the refractive indexes of the first layer 311 and the third layer 313 may be different from the refractive indexes of the second layer 312 and the fourth layer 314. In this case, the inorganic layer 310 may function as a distributed Bragg reflector as described above.

Figure 4:
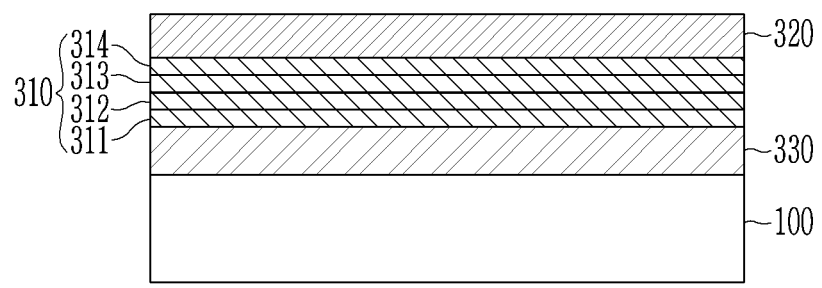
FIG. 4 is a schematic cross-sectional view according to another embodiment.

FIG. 4 is a schematic cross-sectional view according to another embodiment. Referring to FIG. 4, this embodiment may be substantially identical to an embodiment described with reference to FIG. 2 except that the inorganic layer 310 is multi-layered. No detailed descriptions on the same elements will be provided.

Referring to FIG. 4, regarding the display device, the inorganic layer 310 may include a first layer 311, a second layer 312, a third layer 313, and a fourth layer 314. FIG. 4 illustrates the configuration that the inorganic layer 310 includes four layers, which is however an example, and the inorganic layer 310 may include two to ten layers.

The first layer 311 to the fourth layer 314 may include at least one of a SiON, a $SiN_x$, and a $SiO_x$.

In this case, the first layer 311 and the third layer 313 may include a same material, and the second layer 312 and the fourth layer 314 may include a same material. For example, the first layer 311 and the third layer 313 may include $SiO_2$, and the second layer 312 and the fourth layer 314 may include a SiON. In another example, the first layer 311 and the third layer 313 may include a $SiN_x$, and the second layer 312 and the fourth layer 314 may include a SiON. This however is an example, and the disclosure is not limited thereto.

Further, refractive indexes of the first layer 311 and the third layer 313 may be the same, and refractive indexes of the second layer 312 and the fourth layer 314 may be the same. In this case, the refractive indexes of the first layer 311 and the third layer 313 may be different from the refractive indexes of the second layer 312 and the fourth layer 314. In this case, the inorganic layer 310 may function as a distributed Bragg reflector as described above.

Figure 5:
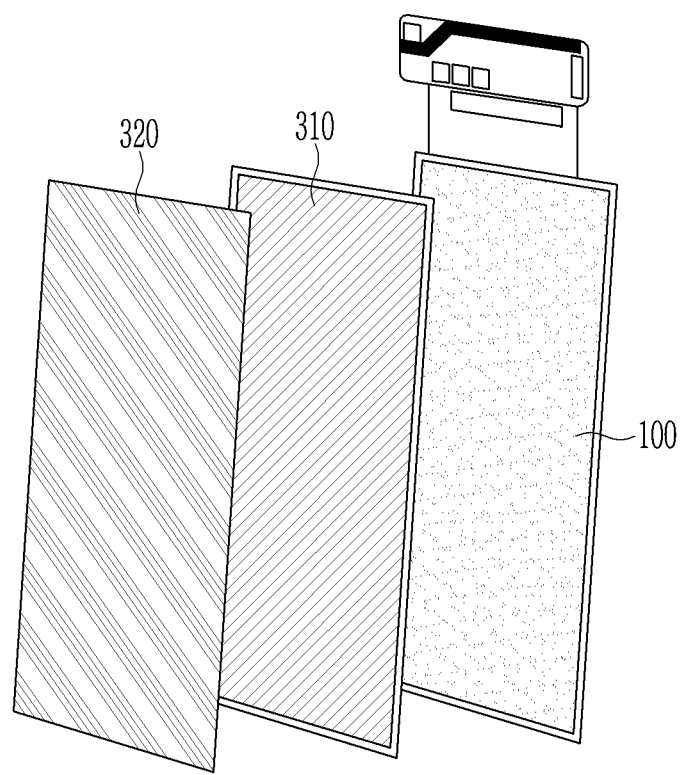
FIG. 5 shows a stacked structure of a display device according to an embodiment in a three-dimensional way.

FIG. 5 shows a stacked structure of a display device according to an embodiment in a three-dimensional way. Referring to FIG. 5, an inorganic layer 310 is positioned on the display panel 100, and a carbon layer 320 is positioned on the inorganic layer 310. The display panel 100 may include a pad portion, and as described above, it may include an LTPS layer on which a transistor is positioned, a light-emitting device connected to the LTPS layer, an encapsulation layer for covering or overlapping the light-emitting device, and a touch sensing layer positioned on the encapsulation layer. The display panel 100 may further include a light blocking member positioned between the light-emitting devices, and a color filter overlapping the light-emitting devices. The embodiment of FIG. 5 may correspond to an embodiment described with reference to FIG. 1 or FIG. 3.

Figure 6:
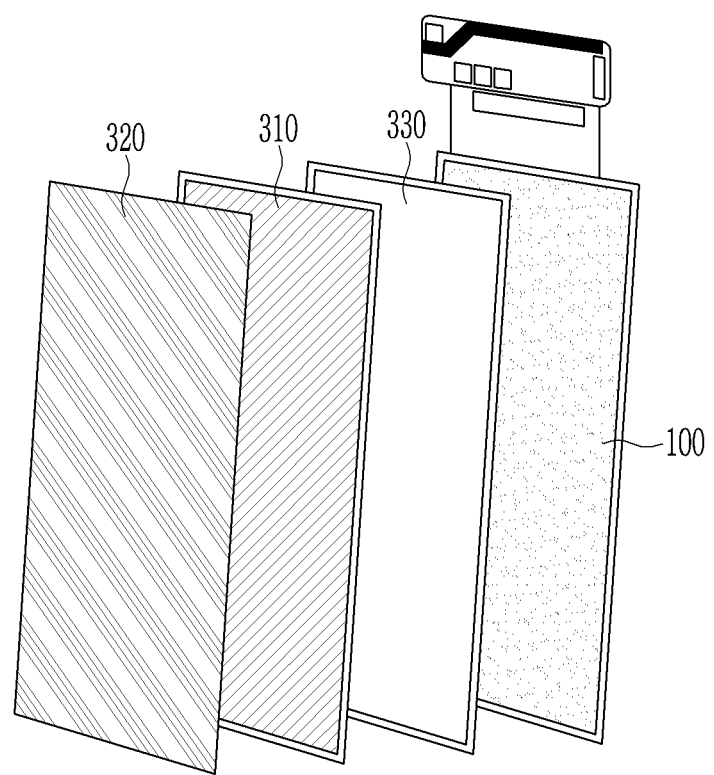
FIG. 6 shows a stacked structure of a display device according to an embodiment in a three-dimensional way.

FIG. 6 shows a stacked structure of a display device according to an embodiment in a three-dimensional way. Referring to FIG. 6, an adhesive layer 330 may be positioned on the display panel 100, an inorganic layer 310 is positioned on the adhesive layer 330, and a carbon layer 320 may be positioned on the inorganic layer 310. The adhesive layer 330 may include an optically clear adhesive (OCA). The display panel 100 may include a pad portion, and as described above, the display panel 100 may include an LTPS layer on which a transistor is positioned, a light-emitting device connected to the LTPS layer, an encapsulation layer for covering the light-emitting device, and a touch sensing layer positioned on the encapsulation layer. The display panel 100 may further include a light blocking member positioned between the light-emitting devices, and a color filter overlapping the light-emitting devices. The embodiment of FIG. 6 may be identical to an embodiment described with reference to FIG. 2 or FIG. 4.

Transmittance and reflectance of the inorganic layer 310 and the carbon layer 320 according to the embodiment will now be described with reference to Table 1.

Table 1 shows results of measuring transmittance and reflectance by changing the stacked structure of the inorganic layer 310 and the refractive index of the carbon layer 320 in a display device including an inorganic layer 310 and a carbon layer 320.

TABLE 1

|  |  | Example 1 | | Example 2 | | |
| --- | --- | --- | --- | --- | --- | --- |
|  |  | Example 1-1 | Example 1-2 | Example 2-1 | Example 2-2 | Example 2-3 |
| Stacked structure | Carbon layer | Refractive index 1.8 Thickness 1 nm | Refractive index 1.6 Thickness 2 nm | Refractive index 2.0 Thickness 2 nm | Refractive index 1.8 Thickness 1 nm | Refractive index 1.6 Thickness 2 nm |
|  | Inorganic layer | $SiN_x$ 167 nm SiON 153 nm $SiN_x$ 149 nm SiON 242 nm | $SiN_x$ 135 nm SiON 175 nm $SiN_x$ 168 nm SiON 391 nm | $SiN_x$ 135 nm SiON 166 nm $SiN_x$ 153 nm SiON 75 nm | $SiN_x$ 135 nm SiON 151 nm $SiN_x$ 335 nm SiON 94 nm | $SiN_x$ 132 nm SiON 194 nm $SiN_x$ 125 nm SiON 95 nm |
|  | Adhesive layer | Including OCA | Including OCA | No adhesive layer | No adhesive layer | No adhesive layer |
| Transmittance |  | 88.3% | 91.9% | 91.4% | 91.7% | 91.9% |
| Reflectance |  | 9.9% | 7.3% | 7.5% | 7.8% | 6.7% |

As shown in Table 1, the display device according to an embodiment of the disclosure includes a stacked structure of the inorganic layer and the carbon layer instead of the cover window, and in this case, it has excellent transmittance and reflectance.

A configuration of a display panel 100 of a display device according to the embodiment will now be described with reference to FIG. 7 to FIG. 12.

Figure 7:
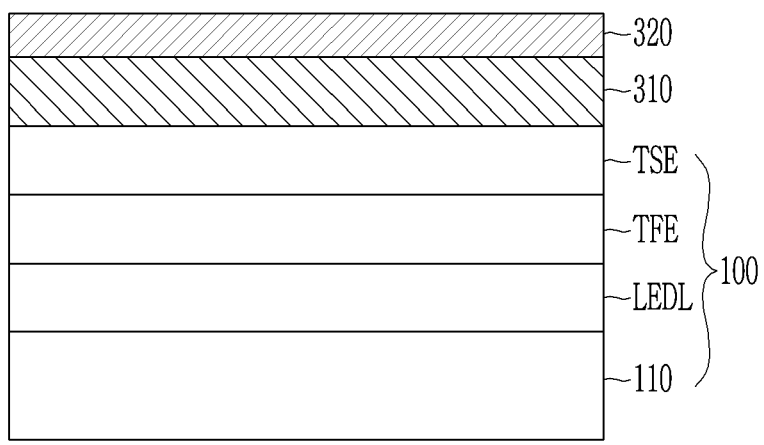
FIG. 7 is a schematic cross-sectional view of a display panel according to another embodiment.

FIG. 7 shows elements of a display panel 100 on a cross-section. Referring to FIG. 7, the display panel 100 may include a substrate 110, a light-emitting device layer LEDL positioned on the substrate 110, a thin film encapsulation layer TFE positioned on the light-emitting device layer LEDL, and a touch sensing layer TSE positioned on the thin film encapsulation layer TFE.

The inorganic layer 310 may directly contact the touch sensing layer TSE. For example, the inorganic layer 310 may be positioned on an upper insulating layer of the touch sensing layer.

Figure 8:
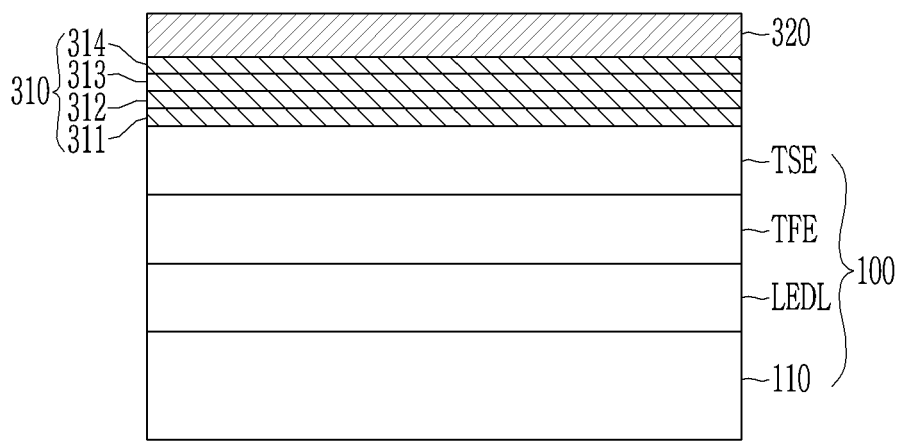
FIG. 8 is a schematic cross-sectional view according to another embodiment.

FIG. 8 is a schematic cross-sectional view according to another embodiment. The embodiment of FIG. 8 may be identical to an embodiment described with reference to FIG. 7 except that the inorganic layer 310 is multi-layered. No detailed descriptions on the same constituent elements will be provided. The description on the configuration that the inorganic layer 310 includes a first layer 311, a second layer 312, a third layer 313, and a fourth layer 314 corresponds to the descriptions given with reference to FIG. 3 and FIG. 4. No detailed descriptions on the same constituent elements will be provided.

Figure 9:
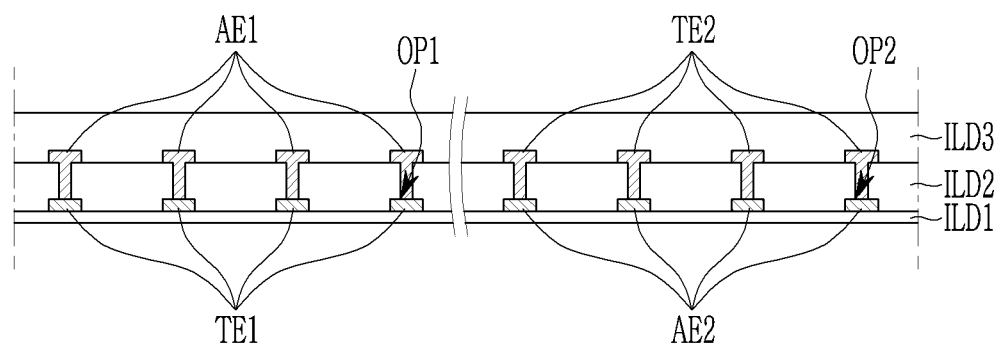
FIG. 9 shows a configuration of a touch sensing layer in a display panel of a display device according to an embodiment.

FIG. 9 shows a configuration of a touch sensing layer TSE in a display panel of a display device according to an embodiment. Referring to FIG. 9, the touch sensing layer TSE may include a first insulating layer ILD1. The first insulating layer ILD1 may be positioned on the thin film encapsulation layer TFE described with reference to FIG. 7 and FIG. 8 and may directly contact the thin film encapsulation layer TFE.

A first sensing electrode TE1 may be positioned on the first insulating layer ILD1. The first sensing electrode TE1 is insulated from the second sensing electrode TE2 with the second insulating layer ILD2 therebetween.

A second auxiliary electrode AE2 and the first sensing electrode TE1 may be positioned on a same layer, and a first auxiliary electrode AE1 and the second sensing electrode TE2 may be positioned on a same layer. The first sensing electrode TE1 may be electrically connected to the first auxiliary electrode AE1 through a first opening OP1 of the second insulating layer ILD2. In a similar manner, the second sensing electrode TE2 may be electrically connected to the second auxiliary electrode AE2 through a second opening OP2 of the second insulating layer ILD2.

Although a planar shape is not illustrated in detail, the first sensing electrode TE1 may include first sensing cells substantially having rhombic shapes, and first connectors for connecting first sensing cells in a first direction. The second auxiliary electrode AE2 and the first sensing electrode TE1 may be positioned on a same layer and may be formed of a same material, and the second auxiliary electrode AE2 may have a substantially rhombic shape.

The second sensing electrode TE2 may include second sensing cells substantially having rhombus shapes, and second connectors for connecting second sensing cells in a second direction. The first auxiliary electrode AE1 and the second sensing electrode TE2 may be positioned on a same layer and may be formed of a same material, and the first auxiliary electrode AE1 may have a rhombic shape.

A third insulating layer ILD3 may be positioned on the second sensing electrode TE2 and the first auxiliary electrode AE1.

Figure 10:
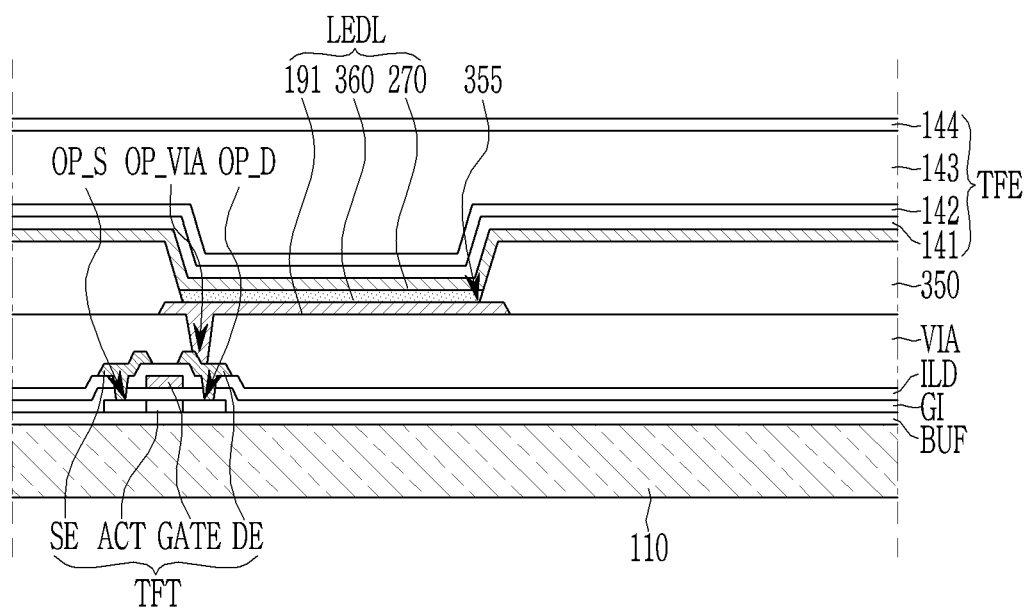
FIG. 10 is a schematic cross-sectional view of a display panel.

A configuration of the display panel 100 excluding the touch sensing layer TSE will now be described in detail. FIG. 10 is a schematic cross-sectional view of a display panel 100. The display panel 100 may be an emissive display device.

Referring to FIG. 10, a buffer layer BUF may be positioned on the substrate 110, and a semiconductor layer ACT may be positioned on the buffer layer BUF. The semiconductor layer ACT may include a channel region not doped with an impurity, and a source region and a drain region positioned on respective sides of the channel region and dope with an impurity. A gate insulating layer GI is positioned on the semiconductor layer ACT, and a gate electrode GATE is positioned on the gate insulating layer GI. The gate electrode GATE overlaps the channel region of the semiconductor layer ACT.

An interlayer insulating layer ILD is positioned on the gate electrode GAT, and a source electrode SE and a drain electrode DE are positioned on the interlayer insulating layer ILD. The source electrode SE and the drain electrode DE are electrically connected to the source region and the drain region of the semiconductor layer ACT, respectively, through openings OP_S and OP_D included in the interlayer insulating layer ILD and the gate insulating layer GI. The transistor TFT shown in FIG. 10 may be a driving transistor and may be overlapped by an insulating layer VIA.

A first electrode 191 is positioned on the insulating layer VIA. A first electrode 191 is positioned for each pixel, and is connected to the drain electrode DE of the driving thin film transistor TFT through an opening OP_VIA positioned in the insulating layer VIA.

A partition wall 350 is positioned on the insulating layer VIA and the first electrode 191. The partition wall 350 includes an opening 355 overlapping the first electrode 191.

An emission layer 360 is positioned on the first electrode 191, and a second electrode 270 is positioned on the emission layer 360 and the first electrode 191. The second electrode 270 may be positioned on the entire display unit regardless of the pixels. The first electrode 191, the second electrode 270, and the emission layer 360 may configure (or form) a light-emitting device LED. One of the first electrode 191 and the second electrode 270 injects holes into the emission layer 360, and the other injects electrons into the emission layer 360. The electrons and the holes are combined on the emission layer 360 to generate excitons, and light emits by energy generated when the excitons fall to a ground state from an excited state.

The light-emitting device LED is very weak against moisture and oxygen, so the thin film encapsulation layer TFE seals the light-emitting device LED to block permeation of moisture and oxygen. The thin film encapsulation layer TFE may be configured with a multilayer of an inorganic film and an organic film. For example, the thin film encapsulation layer TFE may include a buffer layer 141, a first inorganic film 142, an organic film 143, and a second inorganic film 144 on the second electrode 270. The buffer layer 141 may include a LiF, and the first inorganic film 142 and the second inorganic film 144 may include one of $Al_2O_3$, a $SiN_x$, and $SiO_2$. The organic film 143 may include one of epoxy, acrylate, and urethane acrylate.

Figure 11:
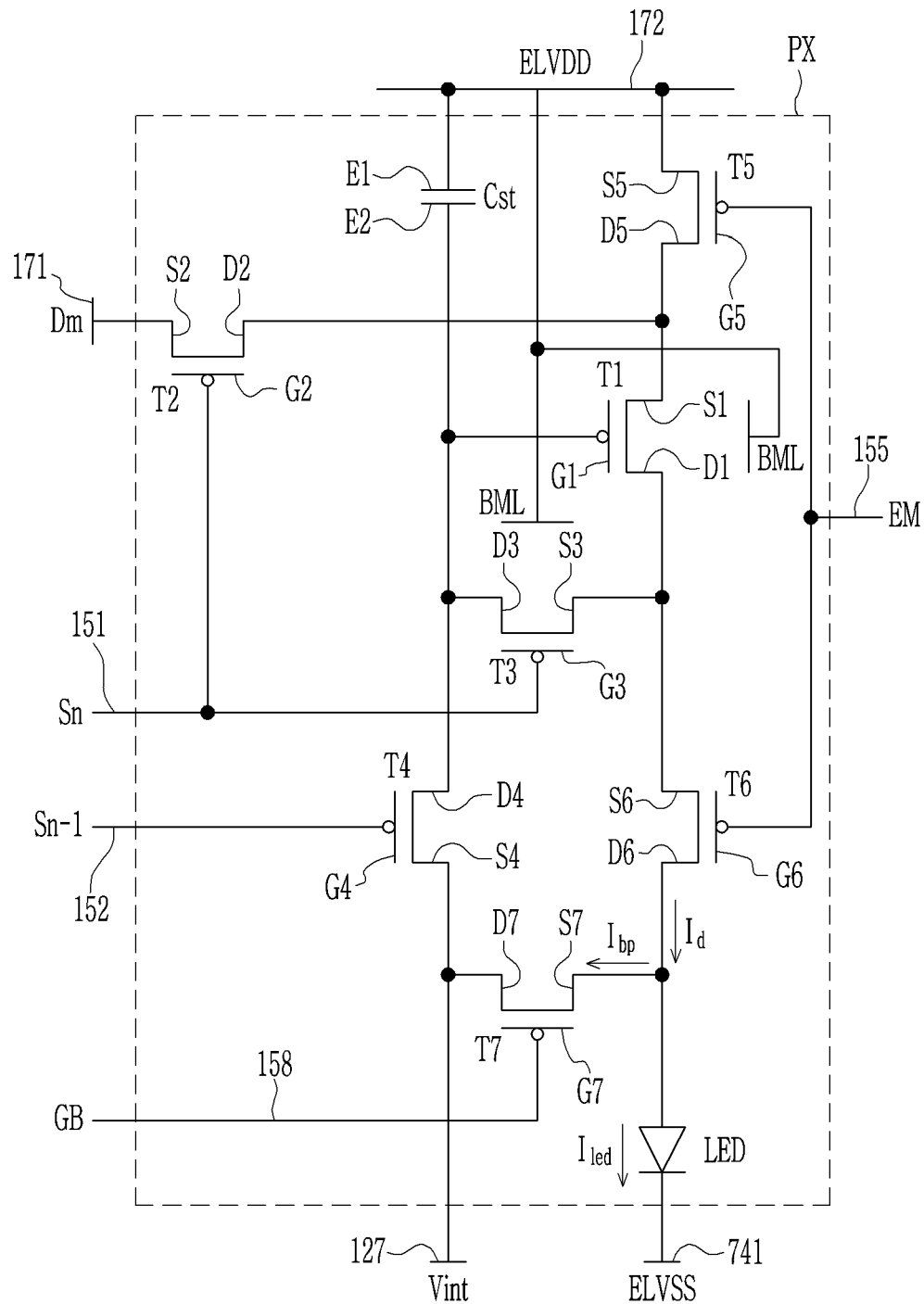
FIG. 11 is a schematic circuit diagram of a pixel on a display panel according to an embodiment.
Figure 12:
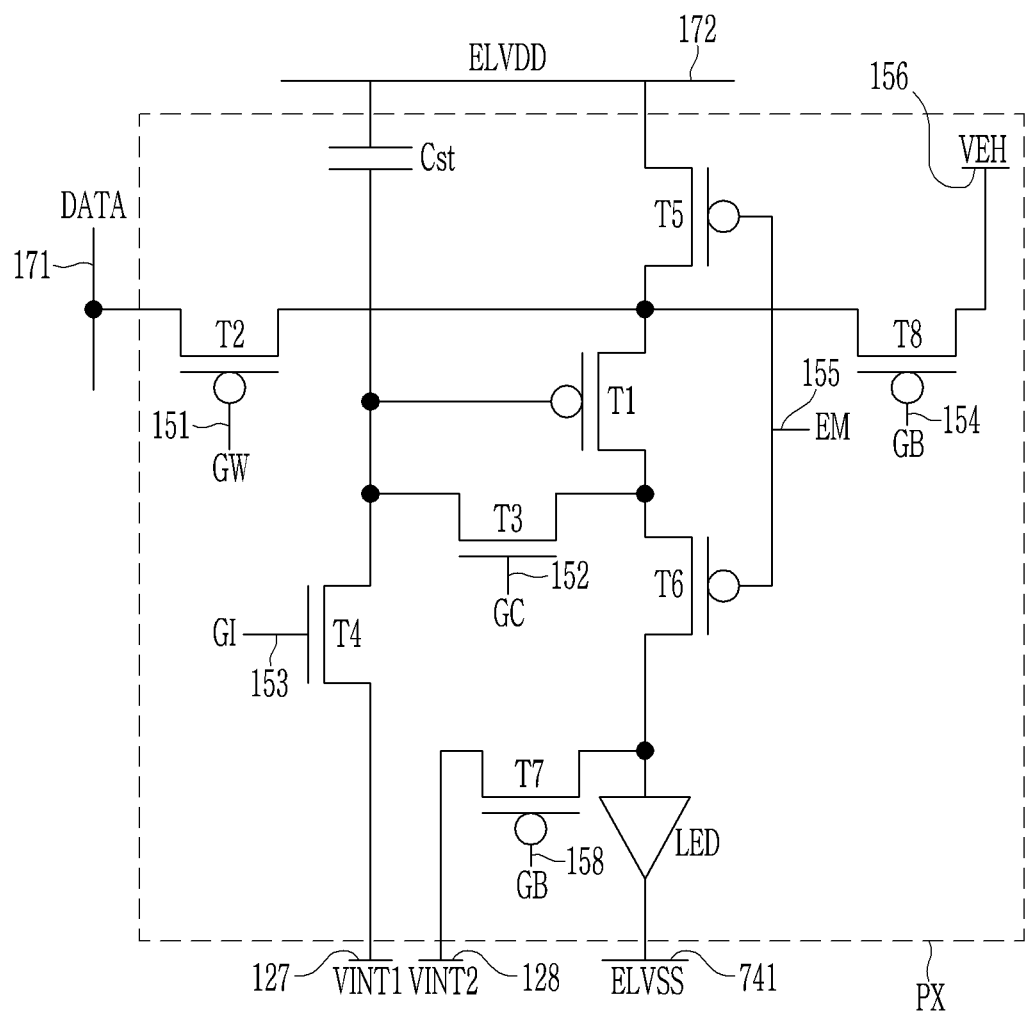
FIG. 12 is a schematic circuit diagram of a pixel on a display panel according to an embodiment.

The pixel of the display panel 100 will now be described. FIG. 11 and FIG. 12 respectively are circuit diagrams of a pixel according to the embodiment.

FIG. 11 shows a circuit diagram of a pixel on a display panel according to an embodiment.

Referring to FIG. 11, the pixel PX of the display panel may include transistors (T1, T2, T3, T4, T5, T6, and T7) electrically connected to signal lines 127, 151, 152, 155, 158, 171, 172, and 741, a storage capacitor Cst, and a light-emitting device LED.

Transistors (T1, T2, T3, T4, T5, T6, and T7) may include a driving transistor T1, a second transistor T2 and a third transistor T3 that are switching transistors electrically connected to the scan line 151, and transistors T4 to T7 (hereinafter, compensation transistors) for performing operations for operating the light emitting diode LED. The compensation transistors (T4, T5, T6, and T7) may include a fourth transistor T4, a fifth transistor T5, a sixth transistor T6, and a seventh transistor T7.

Signal lines 127, 151, 152, 155, 158, 171, 172, and 741 may include a scan line 151, a second scan line 152, an emission control line 155, a bypass control line 158, a data line 171, a driving voltage line 172, an initialization voltage line 127, and a common voltage line 741. The bypass control line 158 may be part of the second scan line 152 or may be electrically connected thereto. In another way, the bypass control line 158 may be part of the scan line 151 or may be electrically connected thereto.

The scan line 151 may be electrically connected to the gate driver and transmits a scan signal Sn to the second transistor T2 and the third transistor T3. The second scan line 152 may be electrically connected to the gate driver and transmit a previous-stage scan signal Sn-1 applied to the pixel PX positioned on the previous stage to the fourth transistor T4. The emission control line 155 may be electrically connected to the emission controller and transmit an emission control signal EM for the light emitting diode LED to control an emission time to the fifth transistor T5 and the sixth transistor T6. The bypass control line 158 may transmit a bypass signal GB to the seventh transistor T7.

The data line 171 may be a wire for transmitting the data voltage Dm generated by the data driver, and luminance of light emitted by the light emitting diode LED (also referred to as a light-emitting device) may be changed according to the data voltage Dm. The driving voltage line 172 may apply a driving voltage ELVDD. The initialization voltage line 127 may transmit an initialization voltage Vint for initializing the driving transistor T1. The common voltage line 741 may apply a common voltage ELVSS. A constant voltage may be applied to the driving voltage line 172, the initialization voltage line 127, and the common voltage line 741.

Transistors will now be described.

The driving transistor T1 controls an output current according to a data voltage Dm. The output driving current Id is applied to the light emitting diode LED to control brightness of the light emitting diode LED according to the data voltage Dm. For this purpose, the first electrode S1 of the driving transistor T1 is disposed to receive the driving voltage ELVDD. The first electrode S1 may be electrically connected to the driving voltage line 172 via the fifth transistor T5. Also, the first electrode S1 of the driving transistor T1 may be electrically connected to the second electrode D2 of the second transistor T2 to receive the data voltage Dm. The second electrode D1 (or an output electrode) of the driving transistor T1 may be disposed to output a current to the light emitting diode LED. The second electrode D1 of the driving transistor T1 may be electrically connected to the anode of the light emitting diode LED via the sixth transistor T6. The gate electrode G1 may be electrically connected to a first electrode (or second storage electrode E2) of the storage capacitor Cst. The voltage at the gate electrode G1 is changed according to the voltage stored in the storage capacitor Cst, and the driving current Id output by the driving transistor T1 is changed.

The second transistor T2 receives the data voltage Dm in the pixel PX. The gate electrode G2 may be electrically connected to the scan line 151, and the first electrode S2 may be electrically connected to the data line 171. The second electrode D2 of the second transistor T2 may be electrically connected to the first electrode S1 of the driving transistor T1. In case that the second transistor T2 is turned on according to the scan signal Sn transmitted through the scan line 151, the data voltage Dm transmitted through the data line 171 is transmitted to the first electrode S1 of the driving transistor T1.

The third transistor T3 allows the compensation voltage (i.e., the voltage of Dm+Vth) that is changed in case that the data voltage Dm passes through the driving transistor T1 to be transmitted to the second storage electrode E2 of the storage capacitor Cst. The gate electrode G3 may be electrically connected to the scan line 151, and the first electrode S3 may be electrically connected to the second electrode D1 of the driving transistor T1. The second electrode D3 of the third transistor T3 may be electrically connected to the second storage electrode E2 of the storage capacitor Cst and the gate electrode G1 of the driving transistor T1. The third transistor T3 is turned on by the scan signal Sn transmitted through the scan line 151 to electrically connect the gate electrode G1 of the driving transistor T1 and the second electrode D1 and also connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The gate electrode G4 may be electrically connected to the second scan line 152, and the first electrode S4 may be electrically connected to the initialization voltage line 127. The second electrode D4 of the fourth transistor T4 may be electrically connected to the second storage electrode E2 of the storage capacitor Cst, the gate electrode G1 of the driving transistor T1, and the second electrode D3 of the third transistor T3. The fourth transistor T4 may transmit the initialization voltage Vint to the gate electrode G1 of the driving transistor T1 and the second storage electrode E2 of the storage capacitor Cst according to the previous-stage scan signal Sn-1 received through the second scan line 152. Accordingly, the gate voltage at the gate electrode G1 of the driving transistor T1 and the storage capacitor Cst are initialized. The initialization voltage Vint has a low voltage value and it may be a voltage for turning on the driving transistor T1.

The fifth transistor T5 may transmit the driving voltage ELVDD to the driving transistor T1. The gate electrode G5 may be electrically connected to the emission control line 155, and the first electrode S5 may be electrically connected to the driving voltage line 172. The second electrode D5 of the fifth transistor T5 may be electrically connected to the first electrode S1 of the driving transistor T1.

The sixth transistor T6 may transmit the driving current Id output by the driving transistor T1 to the light emitting diode LED. The gate electrode G6 may be electrically connected to the emission control line 155, and the first electrode S6 may be electrically connected to the second electrode D1 of the driving transistor T1. The second electrode D6 of the sixth transistor T6 may be electrically connected to the anode of the light emitting diode LED.

The fifth transistor T5 and the sixth transistor T6 are simultaneously turned on by the emission control signal EM received through the emission control line 155, and when the driving voltage ELVDD is applied to the first electrode S1 of the driving transistor T1 through the fifth transistor T5, the driving transistor T1 outputs the driving current Id according to the voltage (i.e., the voltage at the second storage electrode E2 of the storage capacitor Cst) at the gate electrode G1 of the driving transistor T1. The output driving current Id is transmitted to the light emitting diode LED through the sixth transistor T6. As the current $I_{led}$ flows to the light emitting diode LED, the light emitting diode LED emits light.

The seventh transistor T7 initializes the anode of the light emitting diode LED. The gate electrode G7 may be electrically connected to the bypass control line 158, the first electrode S7 may be electrically connected to the anode of the light emitting diode LED, and the second electrode D7 may be electrically connected to the initialization voltage line 127. The bypass control line 158 may be electrically connected to the second scan line 152, and the bypass signal GB is a signal with the same timing as the previous-stage scan signal Sn-1. The bypass control line 158 may not be electrically connected to the second scan line 152 and may transmit a signal that is different from the previous-stage scan signal Sn-1. In case that the seventh transistor T7 is turned on by the bypass signal GB, the initialization voltage Vint is applied to the anode of the light emitting diode LED to be initialized.

The first storage electrode E1 of the storage capacitor Cst may be electrically connected to the driving voltage line 172, and the second storage electrode E2 may be electrically connected to the gate electrode G1 of the driving transistor T1, the second electrode D3 of the third transistor T3, and the second electrode D4 of the fourth transistor T4. As a result, the second storage electrode E2 determines the voltage at the gate electrode G1 of the driving transistor T1, may receive the data voltage Dm through the second electrode D3 of the third transistor T3, or may receive the initialization voltage Vint through the second electrode D4 of the fourth transistor T4.

The anode of the light emitting diode LED may be electrically connected to the second electrode D6 of the sixth transistor T6 and the first electrode S7 of the seventh transistor T7, and the cathode may be electrically connected to the common voltage line 741 for transmitting the common voltage ELVSS.

In an embodiment described with reference to FIG. 11, the pixel circuit includes seven transistors (T1 to T7) and one capacitor Cst, but the disclosure is not limited thereto, and a number of transistors, a number of capacitors, and connections thereof are changeable in various ways.

FIG. 12 shows a circuit diagram of a pixel on a display panel according to an embodiment.

As shown in FIG. 12, a pixel PX of the display device according to an embodiment includes transistors (T1, T2, T3, T4, T5, T6, T7, and T8) electrically connected to various signal lines, a storage capacitor Cst, and a light-emitting device LED.

Signal lines 127, 128, 151, 152, 153, 154, 155, 156, 171, 172, and 741 may be electrically connected to one pixel PX. Signal lines include a first initialization voltage line 127, a second initialization voltage line 128, a first scan line 151, a second scan line 152, an initialization control line 153, a bypass control line 158, an emission control line 155, a reference voltage line 156, a data line 171, a driving voltage line 172, and a common voltage line 741.

The first scan line 151 may be electrically connected to a gate driver (not shown) and may transmit a first scan signal GW to the second transistor T2. The second scan line 152 may apply a voltage with an opposite polarity to the voltage applied to the first scan line 151 at the same time as the signal of the first scan line 151. For example, in case that a high voltage is applied to the first scan line 151, a low voltage may be applied to the second scan line 152. The second scan line 152 may transmit a second scan signal GC to the third transistor T3.

The initialization control line 153 may transmit the initialization control signal GI to the fourth transistor T4. The bypass control line 158 may transmit the bypass signal GB to the seventh transistor T7 and the eighth transistor. The bypass control line 158 may be formed of a next-stage first scan line 151. The emission control line 155 may transmit the emission control signal EM to the fifth transistor T5 and the sixth transistor T6.

The data line 171 may transmit the data voltage DATA generated by a data driver (not shown), and luminance of light emitted by the light emitting diode LED is changed according to the data voltage DATA applied to the pixel PX.

The driving voltage line 172 may apply a driving voltage ELVDD, and the reference voltage line 156 may apply a reference voltage VEH. The first initialization voltage line 127 may transmit a first initialization voltage VINT1, and the second initialization voltage line 128 may transmit a second initialization voltage VINT2. The common voltage line 741 may apply the common voltage ELVSS to the cathode of the light emitting diode LED. In the embodiment, respective constant voltages may be applied to the driving voltage line 172, the reference voltage line 156, the first and second initialization voltage lines 127 and 128, and the common voltage line 741.

A configuration of transistors and a connection relationship thereof will be described in detail below.

The driving transistor T1 may have p-type transistor characteristics and may include a polycrystalline semiconductor. The driving transistor T1 may receive the data voltage DATA and may supply a driving current to the anode of the light emitting diode LED according to the switching operation of the second transistor T2. The brightness of the light emitting diode LED is controlled according to the driving current output to the anode of the light emitting diode LED, so the luminance of the light emitting diode LED may be controlled according to the data voltage DATA applied to the pixel PX. For this purpose, a first region of the driving transistor T1 may be disposed to receive the driving voltage ELVDD, and it may be electrically connected to the driving voltage line 172 via the fifth transistor T5. Also, the first region of the driving transistor T1 may be electrically connected to the second region of the second transistor T2 to receive the data voltage DATA. In another example, the second region of the driving transistor T1 is disposed to output the current to the light emitting diode LED and may be electrically connected to the anode of the light emitting diode LED via the sixth transistor T6. The second region of the driving transistor T1 may transmit the data voltage DATA applied to the first region to the third transistor T3. The gate electrode of the driving transistor T1 may be electrically connected to a first electrode of the storage capacitor Cst (hereinafter, a second storage electrode). The voltage at the gate electrode of the driving transistor T1 is changed according to the voltage stored in the storage capacitor Cst, and the driving current output by the driving transistor T1 is changed. The storage capacitor Cst maintains the voltage at the gate electrode of the driving transistor T1 for a frame.

The second transistor T2 may have p-type transistor characteristics and may include a polycrystalline semiconductor. The second transistor T2 allows the data voltage DATA to be received into the pixel PX. The gate electrode of the second transistor T2 may be electrically connected to the first scan line 151. The first region of the second transistor T2 may be electrically connected to the data line 171. The second region of the second transistor T2 may be electrically connected to the first region of the driving transistor T1. In case that the second transistor T2 is turned on by a low-voltage signal of the first scan signal GW transmitted through the first scan line 151, the data voltage DATA transmitted through the data line 171 is transmitted to the first region of the driving transistor T1.

The third transistor T3 may have n-type transistor characteristics and may include an oxide semiconductor. The third transistor T3 electrically connects the second region of the driving transistor T1 and the gate electrode of the driving transistor T1. As a result, it allows the compensation voltage that is generated in case that the data voltage DATA passes through the driving transistor T1 to be transmitted to the second storage electrode of the storage capacitor Cst. The gate electrode of the third transistor T3 may be electrically connected to the second scan line 152, and the first region of the third transistor T3 may be electrically connected to the second region of the driving transistor T1. The second region of the third transistor T3 may be electrically connected to the second storage electrode of the storage capacitor Cst and the gate electrode of the driving transistor T1. The third transistor T3 is turned on by a high-voltage signal of the second scan signal GC received through the second scan line 152 to electrically connect the gate electrode of the driving transistor T1 and the second region of the driving transistor T1, and it may transmit the voltage applied to the gate electrode of the driving transistor T1 to the second storage electrode of the storage capacitor Cst to store it in the storage capacitor Cst.

The fourth transistor T4 may have n-type transistor characteristics and may include an oxide semiconductor. The fourth transistor T4 initializes the gate electrode of the driving transistor T1 and the second storage electrode of the storage capacitor Cst. The gate electrode of the fourth transistor T4 may be electrically connected to the initialization control line 153, and the first region of the fourth transistor T4 may be electrically connected to the first initialization voltage line 127. The second region of the fourth transistor T4 may be electrically connected to the second storage electrode of the storage capacitor Cst, the gate electrode of the driving transistor T1, and the second region of the third transistor T3. The fourth transistor T4 is turned on by a high-voltage signal of the initialization control signal GI received through the initialization control line 153, and in this case, it may transmit the first initialization voltage VINT1 to the gate electrode of the driving transistor T1 and the second storage electrode of the storage capacitor Cst. Accordingly, the voltage at the gate electrode of the driving transistor T1 and the storage capacitor Cst may be initialized.

The fifth transistor T5 may have p-type transistor characteristics and may include a polycrystalline semiconductor. The fifth transistor T5 may transmit the driving voltage ELVDD to the driving transistor T1. The gate electrode of the fifth transistor T5 may be electrically connected to the emission control line 155, the first region of the fifth transistor T5 may be electrically connected to the driving voltage line 172, and the second region of the fifth transistor T5 may be electrically connected to the first region of the driving transistor T1.

The sixth transistor T6 may have p-type transistor characteristics and may include a polycrystalline semiconductor. The sixth transistor T6 may transmit the driving current output by the driving transistor T1 to the light emitting diode LED. The gate electrode of the sixth transistor T6 may be electrically connected to the emission control line 155, the first region of the sixth transistor T6 may be electrically connected to the second region of the driving transistor T1, and the second region of the sixth transistor T6 may be electrically connected to the anode of the light emitting diode LED.

The seventh transistor T7 may have p-type transistor characteristics and may include a polycrystalline semiconductor. The seventh transistor T7 initializes the anode of the light emitting diode LED. The gate electrode of the seventh transistor T7 may be electrically connected to the bypass control line 158, the first region of the seventh transistor T7 may be electrically connected to the anode of the light emitting diode LED, and the second region of the seventh transistor T7 may be electrically connected to the second initialization voltage line 128. In case that the seventh transistor T7 is turned on by a low-voltage signal of the bypass signal GB, the second initialization voltage VINT2 is applied to the anode of the light emitting diode LD to be initialized.

The eighth transistor T8 may have p-type transistor characteristics and may include a polycrystalline semiconductor. The gate electrode of the eighth transistor T8 may be electrically connected to the bypass control line 158, the first region of the eighth transistor T8 may be electrically connected to the reference voltage line 156, and the second region of the eighth transistor T8 may be electrically connected to the first region of the driving transistor T1. In case that the eighth transistor T8 is turned on by a low-voltage signal of the bypass signal GB, the reference voltage VEH is applied to the first region of the driving transistor T1.

A pixel has been described to include eight transistors (T1 to T8) and one storage capacitor Cst, but the disclosure is not limited thereto, and a number of transistors, a number of capacitors, and connections thereof are changeable in various ways.

In the embodiment, the driving transistor T1 may include a polycrystalline semiconductor. Further, the third transistor T3 and the fourth transistor T4 may include an oxide semiconductor. The second transistor T2, the fifth transistor T5, the sixth transistor T6, the seventh transistor T7, and the eighth transistor T8 may include polycrystalline semiconductors. They are not limited thereto, and at least one of the second transistor T2, the fifth transistor T5, the sixth transistor T6, the seventh transistor T7, and the eighth transistor T8 may include an oxide semiconductor. In the embodiment, in case that the third transistor T3 and the fourth transistor T4 have a semiconductor material that is different from the driving transistor T1, they may be further stably driven, and reliability may be improved.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:
1. A display device comprising:
    a display panel;
    an inorganic layer directly contacting the display panel; and
    a carbon layer directly contacting the inorganic layer, wherein
    a thickness of the carbon layer is about 1 nm to about 10 nm,
    the carbon layer includes a halogen, and
    the carbon layer includes a region arranged in a simple cubic (SC) structure and a region arranged in a hexagonal close packed (HCP) structure.
2. The display device of claim 1, wherein the carbon layer includes amorphous carbon.
3. The display device of claim 1, wherein the carbon layer includes crystalline carbon.
4. The display device of claim 3, wherein the carbon layer includes a region in which amorphous carbon is disposed.
5. The display device of claim 1, wherein a refractive index of the carbon layer is about 1.6 to about 2.0.
6. The display device of claim 1, wherein the inorganic layer includes a silicon-containing compound.

7. The display device of claim 1, wherein the inorganic layer is a single layer or a multilayer.

8. The display device of claim 1, wherein a thickness of the inorganic layer is about 400 nm to about 1 μm.

9. The display device of claim 1, wherein the inorganic layer has a single-layered or multi-layered structure including at least one of a SiON, a $SiN_x$, and a $SiO_x$.

10. The display device of claim 9, wherein the inorganic layer includes:
 a first layer including a $SiN_x$;
 a second layer including a SiON;
 a third layer including a $SiN_x$; and
 a fourth layer including a SiON.

11. The display device of claim 1, wherein the inorganic layer forms a distributed Bragg reflector.

12. The display device of claim 1, wherein
 the display panel includes:
  a substrate;
  a light-emitting device layer disposed on the substrate;
  a thin film encapsulation layer disposed on the light-emitting device layer; and
  a touch sensing layer disposed on the thin film encapsulation layer, and
 the inorganic layer directly contacts the touch sensing layer.

13. The display device of claim 12, wherein
 the touch sensing layer includes:
  a first insulating layer directly contacting the thin film encapsulation layer;
  a first sensing electrode disposed on the first insulating layer;
  a second insulating layer disposed on the first sensing electrode;
  a second sensing electrode disposed on the second insulating layer; and
  a third insulating layer disposed on the second sensing electrode, and
 the inorganic layer directly contacts the third insulating layer of the touch sensing layer.

14. The display device of claim 1, wherein the display device does not include a cover window.

15. The display device of claim 1, wherein
 a transmittance of a stacked structure of the inorganic layer and the carbon layer is equal to or greater than about 88%, and
 a reflectance of the stacked structure of the inorganic layer and the carbon layer is equal to or less than about 10%.

16. A display device comprising:
 a display panel;
 an adhesive layer directly contacting the display panel;
 an inorganic layer directly contacting the adhesive layer; and
 a carbon layer directly contacting the inorganic layer, wherein
 a thickness of the carbon layer is about 1 nm to about 10 nm,
 the carbon layer includes a halogen, and
 the carbon layer includes a region arranged in a simple cubic (SC) structure and arranged in a hexagonal close packed (HCP) structure.

17. The display device of claim 16, wherein the carbon layer includes amorphous carbon or crystalline carbon.

18. The display device of claim 16, wherein
 the inorganic layer has a single-layered or multi-layered structure including a silicon-containing compound, and
 a thickness of the inorganic layer is about 400 nm to about 1 μm.

* * * * *